US009333591B2

(12) United States Patent
Buchalla et al.

(10) Patent No.: US 9,333,591 B2
(45) Date of Patent: May 10, 2016

(54) PROCESS FOR ELECTRIC BONDING OF AN ALUMINUM WIRE

(71) Applicant: HANNING ELEKTRO-WERKE GmbH & Co. KG, Oerlinghausen (DE)

(72) Inventors: Harald Buchalla, Soest (DE); Christian Meyer, Bad Rothenfelde (DE)

(73) Assignee: HANNING ELEKTRO-WERKE GmbH & Co. KG, Oerlinghausen (DE)

( * ) Notice: Subject to any disclaimer, the term of this patent is extended or adjusted under 35 U.S.C. 154(b) by 172 days.

(21) Appl. No.: 13/906,968

(22) Filed: May 31, 2013

(65) Prior Publication Data
US 2013/0327814 A1 Dec. 12, 2013

(30) Foreign Application Priority Data

Jun. 6, 2012 (DE) .......................... 10 2012 011 184
May 14, 2013 (DE) .......................... 10 2013 104 933

(51) Int. Cl.
*B23K 20/24* (2006.01)
*B23K 1/06* (2006.01)
*H01R 43/02* (2006.01)
*B23K 20/10* (2006.01)
*B23K 20/00* (2006.01)
*H01R 43/28* (2006.01)

(52) U.S. Cl.
CPC ............... *B23K 20/24* (2013.01); *B23K 20/10* (2013.01); *H01R 43/0207* (2013.01); *B23K 20/004* (2013.01); *H01L 2224/45015* (2013.01); *H01L 2224/45124* (2013.01); *H01L 2224/45147* (2013.01); *H01L 2224/45565* (2013.01); *H01L 2924/00014* (2013.01); *H01R 43/28* (2013.01)

(58) Field of Classification Search
CPC .................................................... B23K 20/004
USPC ........................................ 228/1.1, 110.1, 111
See application file for complete search history.

(56) References Cited

U.S. PATENT DOCUMENTS

| | | | | |
|---|---|---|---|---|
| 3,717,842 A * | 2/1973 | Douglas, Jr. | ...................... | 29/860 |
| 3,822,465 A * | 7/1974 | Frankort | ................ | B23K 20/10 |
| | | | | 156/73.2 |
| 4,580,713 A * | 4/1986 | Sekibata et al. | .............. | 228/111 |
| 4,712,723 A * | 12/1987 | Moll | ................... | H01R 43/0207 |
| | | | | 156/73.2 |
| 4,860,941 A * | 8/1989 | Otto | .......................... | 228/180.5 |
| 5,110,032 A | 5/1992 | Akiyama et al. | | |
| 5,152,450 A | 10/1992 | Okikawa et al. | | |
| 6,320,155 B1 * | 11/2001 | Barnett | .................... | 219/121.46 |
| 6,412,701 B1 * | 7/2002 | Kohama | .............. | G06K 19/027 |
| | | | | 235/488 |
| 6,527,161 B2 * | 3/2003 | Murakami | ............. | B23K 20/10 |
| | | | | 228/110.1 |
| 6,588,646 B2 * | 7/2003 | Loprire | ...................... | 228/110.1 |
| 6,896,170 B2 * | 5/2005 | Lyn et al. | ....................... | 228/4.5 |
| 7,576,297 B2 * | 8/2009 | Fujita et al. | ............. | 219/121.36 |
| 8,449,712 B2 * | 5/2013 | Inamoto et al. | ............ | 156/272.6 |
| 2007/0228110 A1 * | 10/2007 | Eldridge et al. | ........... | 228/180.5 |
| 2009/0140029 A1 | 6/2009 | Wandke et al. | | |
| 2011/0186334 A1 * | 8/2011 | Humphries et al. | ......... | 174/251 |
| 2012/0085040 A1 | 4/2012 | Ketwitz | | |
| 2012/0298645 A1 | 11/2012 | Kleespiess | | |

FOREIGN PATENT DOCUMENTS

| | | |
|---|---|---|
| DE | 102004004742 A1 | 8/2005 |
| DE | 102007057429 A1 | 6/2009 |
| DE | 102009059307 A1 | 6/2011 |
| JP | 2004363152 A | 12/2004 |

* cited by examiner

*Primary Examiner* — Devang R Patel
(74) *Attorney, Agent, or Firm* — Stephan A. Pendorf; Patent Central LLC

(57) ABSTRACT

A process for electric bonding of an aluminum wire to a contact area which wire, provided with an oxide layer on its outer surface, is wrapped with an insulating lacquer and ultrasonic bonded to said contact area, wherein insulation is removed from the aluminum wire section to be connected to the contact area prior to the ultrasonic bonding process by removing the insulating layer which surrounds the outer surface of the wire with oxide layer by means of an electric plasma.

18 Claims, No Drawings

PROCESS FOR ELECTRIC BONDING OF AN ALUMINUM WIRE

BACKGROUND OF THE INVENTION

1. Field of the Invention

This present invention relates to a process for electric bonding of an aluminum wire to a contact area which wire provided with an oxide layer on its outer surface is wrapped with an insulating lacquer and ultrasonic bonded to said contact area.

2. Description of the Related Art

It has been a customary practice for many years to primarily use copper wires to make coils and windings for electric motors while the use of aluminum wires has been preferred in the recent past for reasons of cost, especially where production in large batches and under price pressure is involved such as for electric motors adopted in white goods (pump drives for dishwashers, laundry washing machines etc.). It has been found in this conjunction that other than copper wires such aluminum wires are not so well solderable and in particular not with adequate reproducibility and reliable performance quality. This means that the electric bonding of aluminum wires by way of soldering methods that have been customary for copper wires to date may create problems. It is however known to connect aluminum wires to a contact area (substrate) by ultrasonic bonding in that an aluminum wire is forced against said contact area under a defined pressure and ultrasonic welded. A factor of importance to the process here is the oxide layer surrounding the outer surface of the wire. This oxide layer constitutes a hard friction partner with the usually plane metallic substrate and hence improves the bonding ability of the aluminum wire.

The use of aluminum wire for coils and/or motor windings calls for the individual windings to be insulated against one another. This is the reason why the outer surface of the aluminum wire is wrapped with an insulating lacquer. Extensive tests have shown that said insulating lacquer has a strong negative effect on the bonding ability of an aluminum wire which when wrapped with insulating lacquer cannot be bonded to a contact area with adequate quality, in particular not in a reproducible, durable and reliable way.

It is an object of this present invention, therefore, to provide a process for removing insulating lacquer from selected areas of an aluminum wire which can be performed reliably and at low cost.

Applicant has initially attempted in a large number of test runs to remove insulating lacquer from aluminum wires by mechanical methods during which it was discovered that in all cases it was not only the insulating lacquer, but also the outer oxide layer of the wire that was removed or at least damaged. This oxide layer damage resulted in that the aluminum wire was less well to bond. Although the oxide layer used to regenerate as a rule after it had been removed or damaged, the time such regeneration takes is a drawback under process aspects.

BRIEF SUMMARY OF THE INVENTION

It has also been tried to remove the insulating lacquer by thermal methods, though due to the small diameter and hence a low thermal capacity of the wire it is a problem to carry out a heat treatment of the wire in the absence of detrimental effects on the process. Temperatures may build up in the wire which must be considered critical particularly in regard to the melting temperature of aluminum. This means that heat treatments are apt to alter the structure of an aluminum wire and to affect the fatigue strength of the bond.

DETAILED DESCRIPTION OF THE INVENTION

To achieve the object of this present invention it has been found convenient for electric bonding to remove insulation from the aluminum wire section to be connected to the contact area prior to the ultrasonic bonding process by removing the insulating layer which surrounds the outer surface of the wire with oxide layer by means of an electric plasma.

The particular advantage of this invention resides in that in removing insulation from an aluminum wire section neither the oxide layer of the aluminum wire is unduly damaged nor the structure of the wire is altered in such a way that negative effects, in particular in regard to longtime stability of the bond, have been produced. This means that by adopting said plasma it is possible to inhibit damages, in particular damages of the type that are not easy to recognize optically such as detrimental structural changes. The plasma treatment permits to remove insulating lacquer in a controlled way in the absence of any negative influences on the bonding ability and/or the mechanical stability of the aluminum wire and/or the oxide layer are affected. It has been found also that this process step is reliable, i.e. capable of being reproduced and automated. Aluminum wires are mainly used to provide coils for transformers or windings for electric motors or other electromagnetic drives in the white goods field. Adopting the process of this present invention is of particular advantage for aluminum wires of 0.1 mm to 0.7 mm diameter.

An electric plasma in the meaning of this invention is any gas that has free charge carriers (ions, electrons and/or charged molecules). It may be a mix of neutral and charged particles or contain charged particles only. A so-called "Normal Pressure or Atmospheric Pressure Plasma" is preferably used.

As regards temperature the electric plasma will be adjusted in such a way that it is warm enough to melt the insulating lacquer on the wire and/or on the oxide layer either completely or in part on the one hand and that will not burn the wire and/or cause detrimental damages to its structure on the other hand. Various tests have shown that satisfactory results are achieved in the temperature range from 200° C. to below 620° C. The process time is selected as a function of temperature and wire geometry in such a way that the aluminum wire section will not get unduly damaged.

A cycle mode according to a preferred embodiment of this invention provides for the insulation to be initially removed from an aluminum wire section and the aluminum wire to be bonded thereafter. Adopting this cycle mode affords the advantage that the automation properties of the process are improved and the production throughput is increased. In particular can a first process time for removal of the insulation and a second process time for ultrasonic bonding of the aluminum wire be tuned to each other in such a way that a high rate of utilization of the automatic bonding unit will be ensured. This implies that this cycle mode particularly improves the economic efficiency of the bonding process also.

According to a modification of this present invention the cycle time is shorter than 10 seconds or preferably shorter than 1 second or particularly preferred shorter than 0.5 second. An advantage afforded by a short cycle time is a high throughput. In particular can the insulation be removed from several aluminum wire sections at a time to realize the cycle times as stated in view of the fact that the insulation removal step takes longer than the bonding operation which means that said first process time is longer than the second process time. The time relationship between insulation removal time and bonding time (including nonproductive times for wire handling, bonding head positioning etc.) can be taken as basis for determining the number of wire sections whose insulation is to be removed in parallel.

A further modification of the invention provides for removal of the insulation first and for bonding the aluminum wire to its contact area with substantially no time lag. Preferably, the time gap between the end of insulation removal and the bonding step is preferably less than 300 seconds, in particular less than 30 seconds. This affords the advantage that the economic efficiency of the process is improved because interim storage of aluminum wire stock is avoided. In particular, both process steps can be performed in one common system and/or by just one automatic processing unit.

Typically, an aluminum section freed from insulation is bonded to a contact area, for instance that of a plug. The respective aluminum wire section can be positioned on and prefixed to said contact area itself for which purpose a nose, a recess or such like may be provided on the plug, for instance. It may be advantageous to remove insulation from the wire by means of an electric plasma after the aluminum wire section has been prefixed to the contact and/or plug. The bonding area then serves as a mirror and/or rebounding surface for the electric plasma on the one hand and for heat dissipation on the other hand. The contact area may for instance be given a pretreatment to prepare it for bonding. Also may a sufficiently hard coating be applied to that area which promotes the bonding process.

A still further modification of this invention provides for the insulation of two aluminum wire sections and/or a plurality of aluminum wire sections of different winding wires to be removed in one single process step. This affords the advantage that the two free wire ends of a coil and/or winding or said plurality of aluminum wire sections of different winding wires can be bonded with no substantial delay. A winding of an electric motor will be connected by bonding a first free end of a winding wire first and a second free end thereafter. The two wire ends had been freed from their insulation before and preferably at the same time.

Another modification of the invention provides for the aluminum wire to be moved while insulation is being removed from a wire section. In particular can the aluminum wire be fed to a bonding tool during insulation removal. This affords the advantage that the processing time for any individual aluminum wire section because the insulation removal step and the transport step are both carried out in parallel. The aluminum wire can be moved particularly well during insulation removal where an electro-chemical etching process does not call for the wire to be accurately positioned within the plasma in the first instance.

Transporting the aluminum wire during insulation removal offers a further benefit in those cases where insulation removal is carried out in a continuous process in which a predetermined or variable number of aluminum wire sections undergo a time shifted electrochemical treatment to remove insulating lacquer.

According to a further modification of this invention a reaction time for insulation removal will be selected such that the insulating lacquer initially applied to an aluminum wire section is removed in an amount equal to at least 50%, preferably at least 75% and particularly preferred at least 85% and/or that at least 50% of an outer surface end of the aluminum wire section, preferably more than 75% and particularly preferred more than 85% is freed from insulating lacquer. An at least 50% removal of insulating lacquer and/or an at least 50% exposure of the outer surface end affords the advantage that adequate contact is achieved during subsequent bonding. Leftover insulating lacquer, if any, will hence not so disadvantageously affect the bonding process that process reliability would be at stake or electric bonding could not be ensured. Tests have demonstrated that removal of insulating lacquer to an extent of at least 75% and/or an exposure of the outer surface end to an extent of at least 75% will improve process reliability and electric bonding ability even further. The tendency in that case is that a larger exposed outer surface end and a lesser presence of insulating lacquer will improve the bonding ability and the quality of an electric bond. It will be understood in this conjunction that particularly good results will be obtained where all of the insulating lacquer is removed and/or where the aluminum wire section is exposed completely.

According to another modification of this invention a first process time for different aluminum wires and/or different insulating lacquers and in particular the time of reaction of the electric plasma on an aluminum wire section will be explored in preliminary tests and then taken as a fixed parameter in the production process. Such preliminary determination of a reaction time for a specific aluminum wire to be processed and a specific insulating lacquer applied thereto permits the production process to be exceptionally simple. A fixed cycle time is obtained particularly where the reaction time for insulation removal from an aluminum wire section has been previously ascertained which is a benefit in the light of process automation properties.

A modification of the invention provides for assessing the amount of insulating lacquer taken away from an aluminum wire section during insulation removal and/or the reaction time left when considering the lacquer removal rate and the reaction time at that instant and/or for generating a signal to end the removal of insulation from said aluminum wire section. This variable determination of reaction time and/or individual generation of a signal for insulation removal to terminate affords the advantage that a high degree of process reliability is achieved. The insulation removal process will be continued when it is found that the amount of insulating lacquer removed and/or the proportion of outer surface end exposed are insufficient. The removal rate may for instance be assessed by monitoring electrical and/or chemical parameters, by weight determination or with the aid of imaging sensors.

A still further modification of the invention provides for a contact arrangement consisting of an aluminum wire and a substrate to be coated with a sealing material which protects the contact assembly against external influences, both mechanical and chemical. The sealant may be any suitable material such as a lacquer, an adhesive or a synthetic resin. This seal may be in the form of a self-curing sheath. Curing may be effected under the action of an activating medium such as UV light also. Lacquer used to provide the coating may be applied by spraying or brushing, for instance. An adhesive will be advantageously applied by brushing and/or dropping methods. Lacquer and adhesive may both be UV hardenable such that the sealing coat will be hardened by means of UV light after the lacquer has been applied. A castable compound, for example of 2-component type, may be additionally applied to provide the sealant coating also. Application may be with or without a pocket for shaping. While it is possible to seal the contact area alone, the complete winding system also may be sealed, in particular with a plastic wrap.

The invention claimed is:

1. A process for electric bonding of an aluminum wire to a contact area, which wire, provided with an oxide layer on its outer surface, is wrapped with an insulating lacquer layer, said process comprising, in order:
   removing the insulating lacquer layer from the aluminum wire section to be connected to the contact area by means of an electric plasma without removing the oxide layer, wherein the electric plasma has a defined temperature of more than 200° C. and less than 620° C., and
   ultrasonic bonding the aluminum wire with oxide layer to the contact area.

2. The process according to claim 1, wherein the insulating lacquer layer is removed from the aluminum wire section in a cycle mode first and the aluminum wire is ultrasonic bonded thereafter.

3. The process according to claim 2, wherein the cycle time is shorter than 10 seconds.

4. The process according to claim 1, wherein removal of the insulating lacquer layer from the aluminum wire section and subsequent bonding of the aluminum wire are carried out in direct succession with a time difference of less than 300 seconds between termination of insulating lacquer layer removal from the aluminum wire section and aluminum wire feeding for ultrasonic bonding.

5. The process according to claim 1, wherein the insulating lacquer is removed from a plurality of aluminum wire sections simultaneously.

6. The process according to claim 1, wherein the insulating lacquer layer is removed from two aluminum wire sections at a time.

7. The process according to claim 1, wherein the aluminum wire is moved during removal of the insulating lacquer layer from the aluminum wire section.

8. The process according to claim 1, wherein a reaction time for removal of the insulating lacquer layer from an aluminum wire section is selected such that at least 50% of the insulating lacquer initially applied is removed and/or that at least 50% of an outer surface end of the aluminum wire section are freed from insulating lacquer.

9. The process according to claim 1, wherein a reaction time for different aluminum wires and/or different insulating lacquers is assessed in preliminary test runs and then taken as fixed parameter in the production process.

10. The process according to claim 1, wherein the lacquer removal rate is determined during insulation removal and while accounting for said lacquer removal rate the remaining reaction time is determined and/or a signal for insulation removal from the respective aluminum wire section to terminate is generated.

11. The process according to claim 1, wherein a contact formed of aluminum wire and contact area is sealed after ultrasonic bonding.

12. The process according to claim 2, wherein the cycle time is shorter than 1 second.

13. The process according to claim 3, wherein the cycle time is shorter than an 0.5 second.

14. The process according to claim 1, wherein removal of the insulating lacquer layer from the aluminum wire section and subsequent bonding of the aluminum wire are carried out in direct succession with a time difference of less than 30 seconds between termination of removal of the insulating lacquer layer from the aluminum wire section and aluminum wire feeding for ultrasonic bonding.

15. The process according to claim 1, wherein the aluminum wire is fed to a bonding tool during removal of insulation from the aluminum wire section.

16. The process according to claim 1, wherein a reaction time for removal of the insulating lacquer layer from an aluminum wire section is selected such that at least 75% of the insulating lacquer initially applied is removed and/or that at least 75% are freed from insulating lacquer.

17. The process according to claim 1, wherein a reaction time for removal of the insulating lacquer layer from an aluminum wire section is selected such that at least 85% of the insulating lacquer initially applied is removed and/or that at least 85% are freed from insulating lacquer.

18. The process according to claim 1, wherein a contact formed of aluminum wire and contact area is wrapped with a sheath after ultrasonic bonding.

* * * * *